United States Patent
Yu

[19]

[11] Patent Number: 6,034,366
[45] Date of Patent: Mar. 7, 2000

[54] COLOR LINEAR CCD IMAGE DEVICE AND DRIVING METHOD

[75] Inventor: Young-June Yu, Seoul, Rep. of Korea

[73] Assignee: LG Semicon Co., Ltd., Chungcheongbuk-do, Rep. of Korea

[21] Appl. No.: 08/606,712

[22] Filed: Feb. 23, 1996

[30] Foreign Application Priority Data

Dec. 27, 1995 [KR] Rep. of Korea ........................ 95 58899

[51] Int. Cl.[7] ...................... H01L 27/148; H01L 31/0232
[52] U.S. Cl. ........................ 250/208.1; 257/222; 257/234; 257/241; 348/283
[58] Field of Search ........................ 377/57, 62; 257/222, 257/234, 241; 250/208.1; 348/282, 283

[56] References Cited

U.S. PATENT DOCUMENTS

| | | | |
|---|---|---|---|
| 5,340,977 | 8/1994 | Kojima et al. | 257/234 |
| 5,345,319 | 9/1994 | Yu | 358/483 |
| 5,426,290 | 6/1995 | Kawamoto et al. | 250/208.1 |

*Primary Examiner*—Gene M. Munson
*Attorney, Agent, or Firm*—Finnegan, Henderson, Farabow, Garrett & Dunner, L.L.P.

[57] ABSTRACT

A color linear CCD for a pickup apparatus comprises a photodiode array including a blue-sensing photodiode array formed between a red-sensing photodiode array and a green-sensing photodiode array. A storage area is located beside of the red-sensing photodiode array for storing the signal charges produced by the red-sensing and blue-sensing photodiode arrays. A first HCCD shift register area is located beside of the green-sensing photodiode array for moving the signal charges produced by the green-sensing photodiode array. A second HCCD shift register area is formed beside of the storage area for alternately receiving the signal charges produced by the red-sensing and blue-sensing photodiode arrays. In another embodiment the red-sensing photodiode array is placed between the blue and green sensing photodiode arrays.

35 Claims, 9 Drawing Sheets

F I G.2b
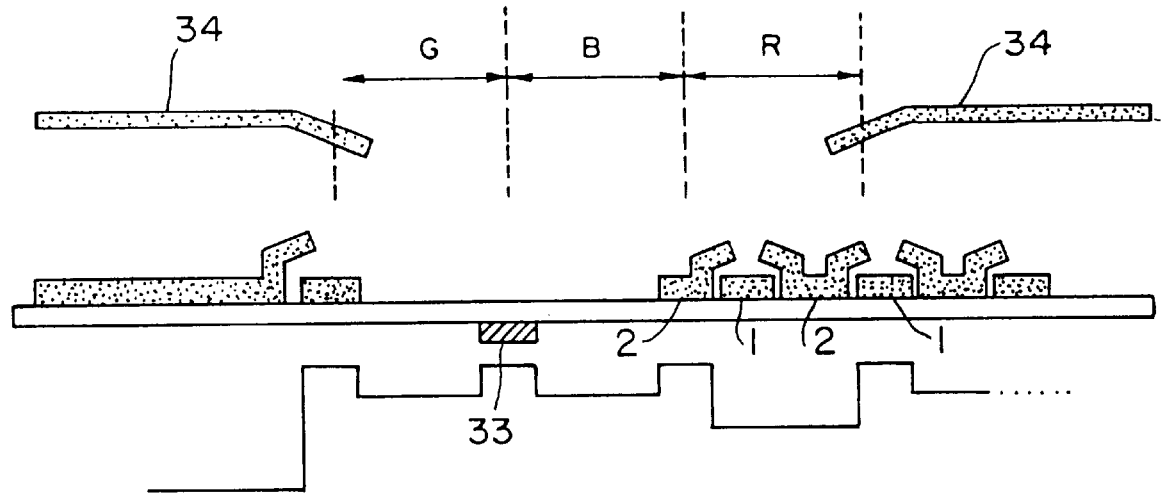
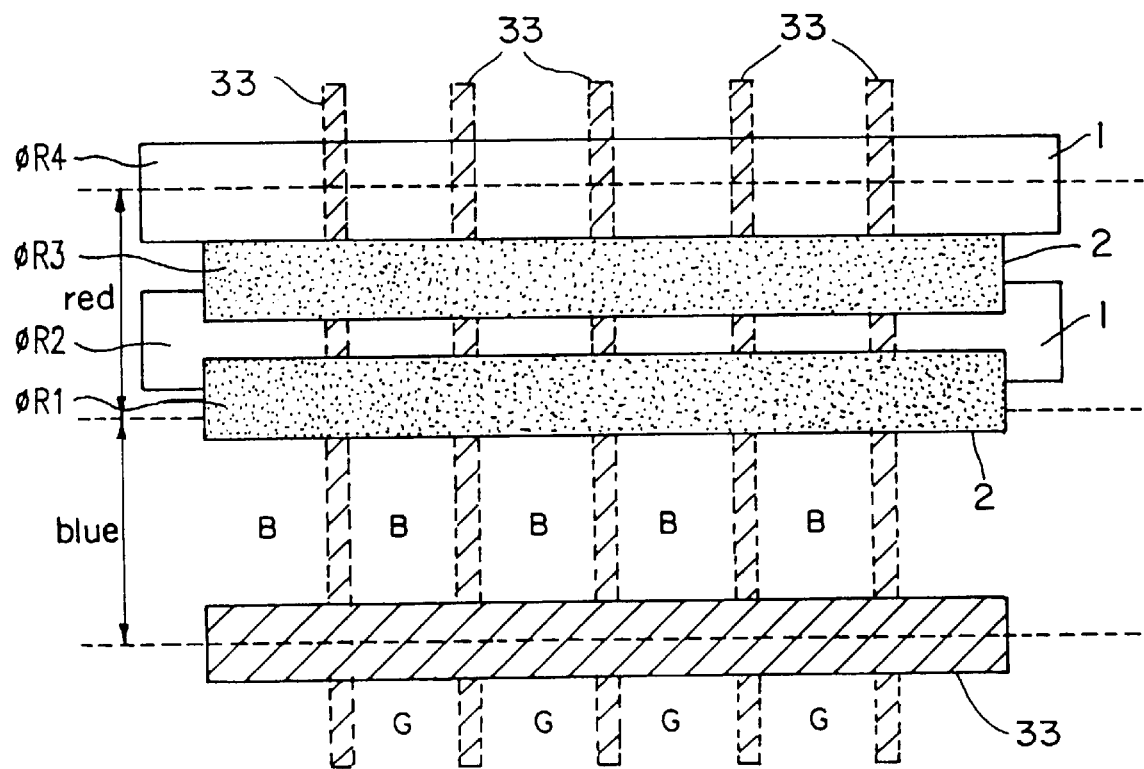
F I G.2c

COLOR LINEAR CCD IMAGE DEVICE AND DRIVING METHOD

BACKGROUND OF THE INVENTION

1. Field of the Invention

The present invention relates to a color linear charge coupled device (CCD) for a pickup apparatus, and more particularly to a color linear device CCD and driving method suitable for improving color resolution and simplifying a corresponding structure by reducing distances between adjacent pixels.

2. Discussion of the Related Art

The conventional color linear CCD shown in FIG. 1 is formed of three linear CCD sets of red, green and blue, which are the three primary colors of light.

Each CCD set includes a photodiode array (1, 2 or 3), a pair of transfer gates 5, one on either side of the photodiode array (1, 2 or 3), horizontal CCD (hereinafter simply referred to as HCCD) shift registers 4 positioned at the outer side of the transfer gates 5, a floating diffusion region (hereinafter referred to as FD) 7 placed on one side of the device and a sensing amplifier 8 connected to FD 7.

Signal charges photoelectrically converted in the photodiodes of photodiode arrays 1, 2 and 3 are transferred to HCCD shift registers 4 when transfer gates 5 are turned or. The photodiodes are divided in an odd/even order for transfer to HCCD shift registers 4 disposed on transfer gates 5 in a zigzag mode.

The photodiode signal charges are moved successively in one direction by clock signals applied to the HCCD shift register 4. The output gate (OG) 6 transfers signal charges from the HCCD shift register 4 to the FD 7 and sensing amplifier 8. The three linear CCDs of red R, green G and blue B are identically constructed except for the color filters. Respective sensing amplifiers 8 provide the signals of red R, green G and blue B.

The conventional color linear CCD described above requires two HCCDs, one FD, and a sensing amplifier for each photodiode array, resulting in a structure for extracting the three colors of red R, green G and blue B that is much more complicated than a black and white linear CCD. Furthermore, two HCCDs 4 are disposed in the space between red R and green G photodiode arrays and between green G and blue B photodiode arrays, so that the distance between the photodiode arrays becomes wide, thus degrading color separation in the vertical direction.

SUMMARY OF THE INVENTION

The present invention is provided to solve the above-described problems of the conventional color linear CCD.

Accordingly, it is an object of the present invention to provide a color linear device CCD and driving method suitable for improving color resolution and simplifying the structure of the device by reducing distances between adjacent pixels.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the above object of the present invention, there is provided a color linear CCD image device including a photodiode array having of a blue-sensing photo diode array formed between a red-sensing photodiode array and a green-sensing photodiode array, each of the photodiode arrays producing signal charges by photoelectric conversion. A storage area is positioned on a side of the red-sensing photodiode array opposite the blue-sensing photodiode array and stores the signal charges produced by the red-sensing and blue-sensing photodiode arrays. A first HCCD shift register area is positioned near a side of the green-sensing photodiode array opposite the blue-sensing photodiode array and accepts the signal charge produced by the green-sensing photodiode array. A second HCCD shift register area is formed beside said storage area and alternately accepts the signal charges produced by the red-sensing and the blue-sensing photodiode arrays.

In another embodiment a red-sensing photodiode array is formed between a blue-sensing photodiode array and a green-sensing photodiode array, each of the photodiode arrays producing signal charges by photoelectric conversion. A storage area is placed on a side of the blue-sensing photodiode array opposite the red-sensing photodiode array and stores the signal charges produced by the red-sensing and blue-sensing photodiode arrays. A first HCCD shift register area is spaced apart from one side of the green-sensing photodiode array to transfer signal charges produced by the green-sensing photodiode array. A second HCCD shift register area is formed to one side of the storage area for alternately transferring the signal charges produced by the red-sensing and blue-sensing photodiode arrays.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 2b shows a section view of the color linear CCD image device shown in FIG. 2a;

FIG. 2c shows a plane layout of the color linear CCD image device shown in FIG. 2a;

FIG. 6 shows the potential wells associated with the color linear CCD image device shown in FIG. 2a.

DETAILED DESCRIPTION OF THE PREFERRED EMBODIMENTS

Figure 1:
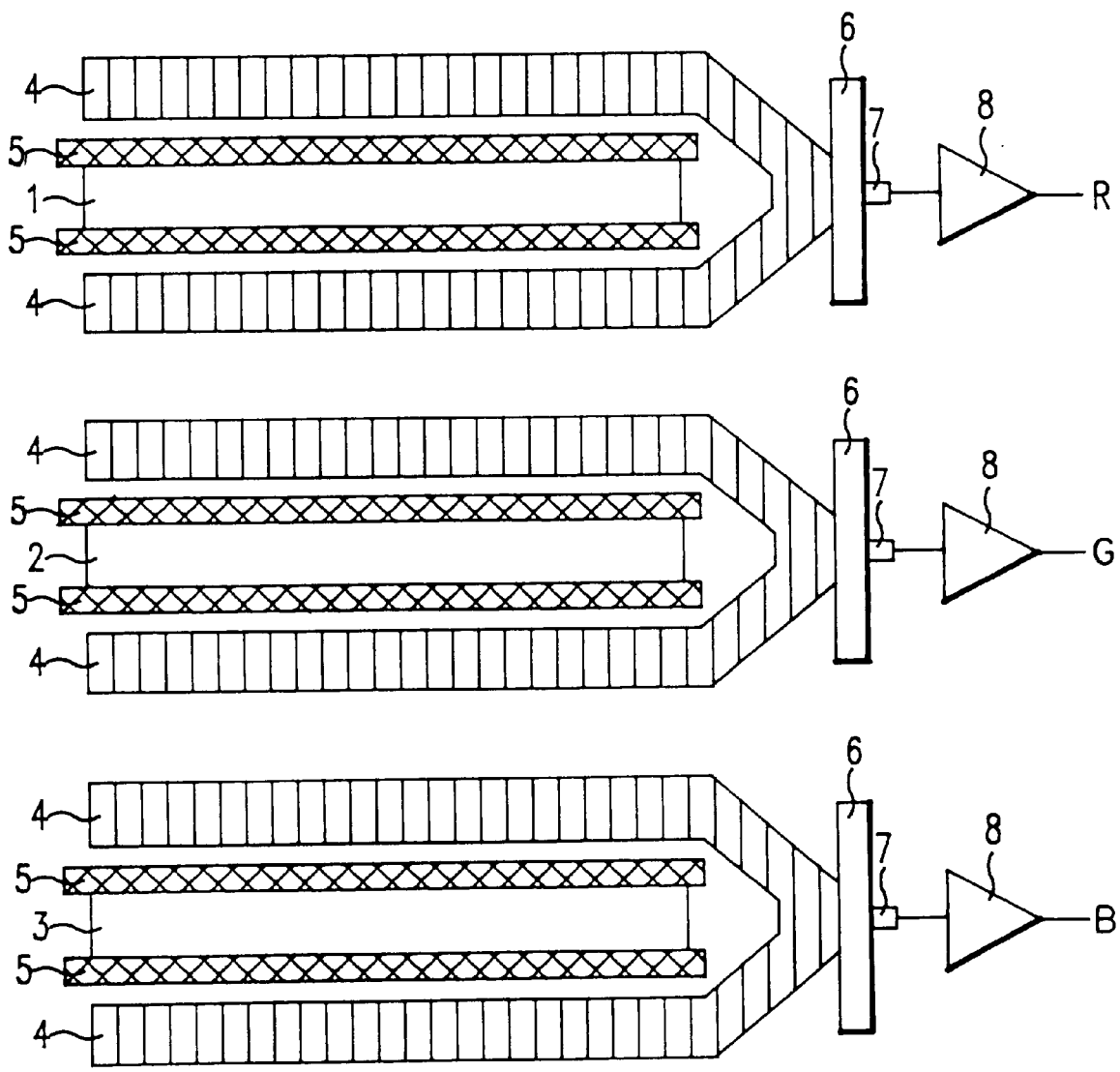
FIG. 1 is a view showing a construction of a conventional color linear CCD image device.
Figure 2A:
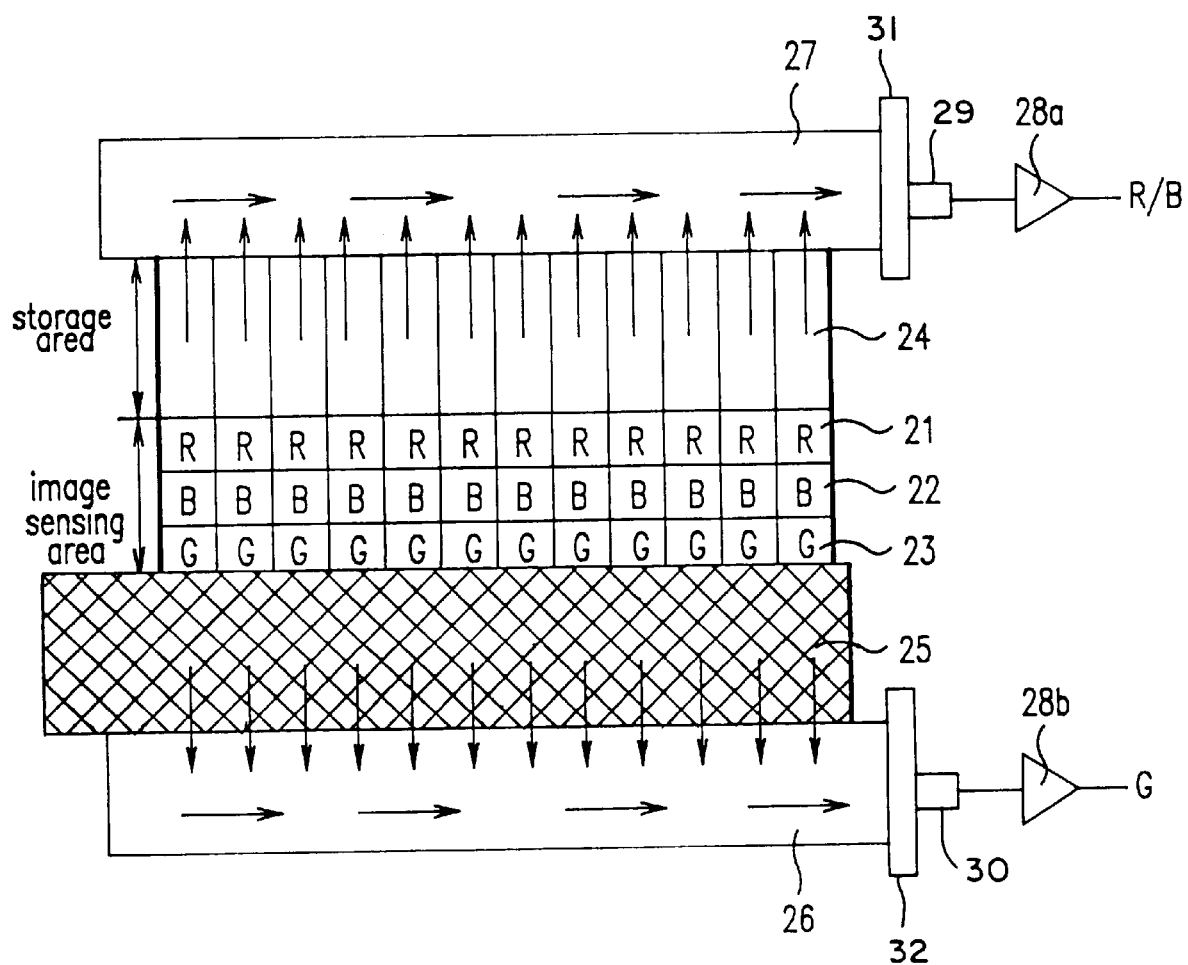
FIG. 2a is a view showing a construction of a color linear CCD image device according to the present invention.
Figure 3:
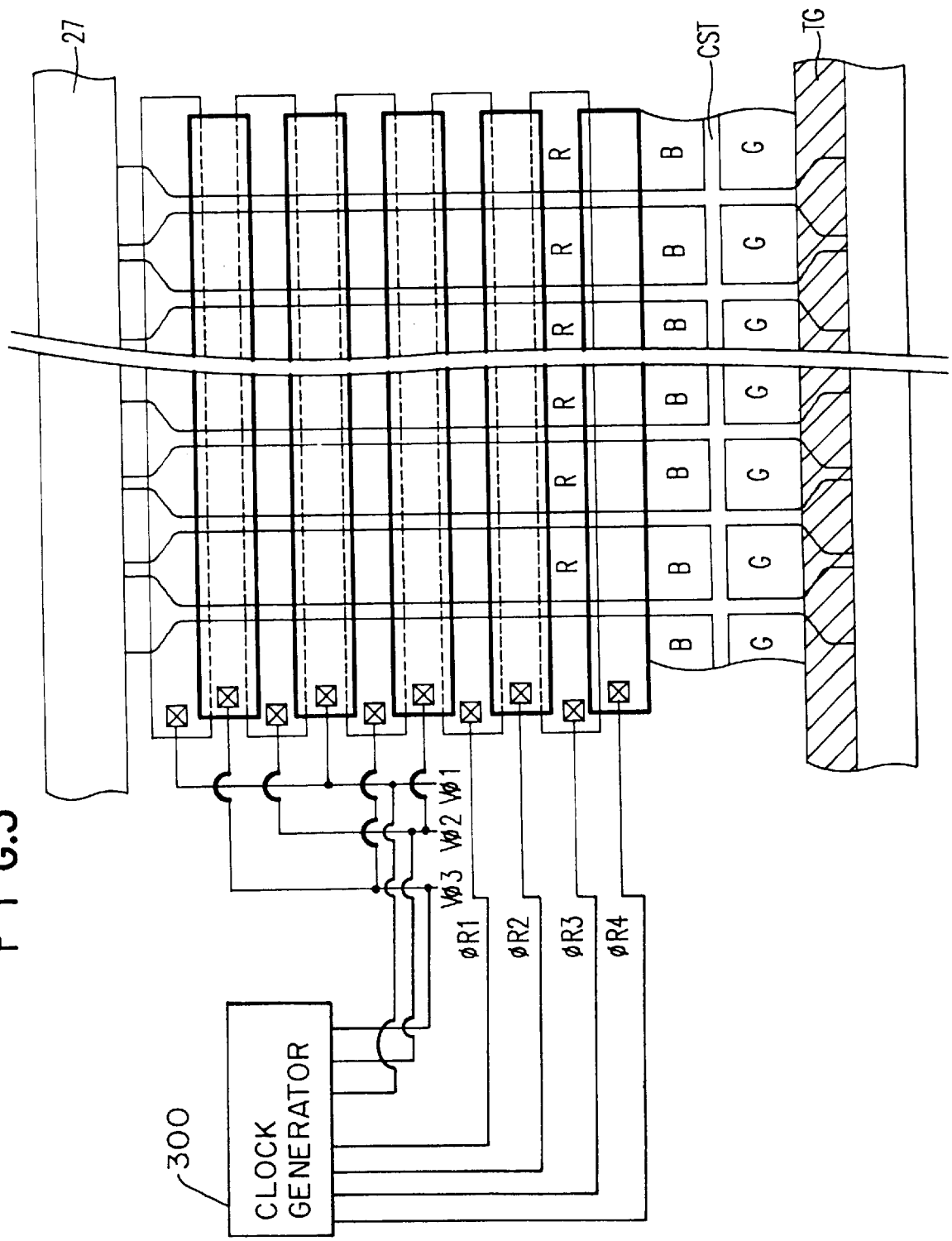
FIG. 3 shows another construction of a color linear CCD image device.

As shown in FIGS. 2a, 2b, 2c, and 3, a blue-sensing photodiode array 22 is formed between a red-sensing photodiode array 21 and a green-sensing photodiode array 23. The photodiode arrays produce a signal charge by photoelectric conversion. A storage area 24 is provided adjacent an upper side of the red-sensing photodiode array 21 and sequentially receives the signal charges produced by the red-sensing photodiode array 21 and the blue-sensing photodiode array 22 in an upward direction, and stores the signal charges produced by the blue-sensing photodiode array 22 while extracting the signal charge produced by the red-sensing photodiode array 21. A first HCCD shift register 26 area is separately formed adjacent a lower side of the green-sensing photodiode array 23 and receives the signal charge produced by the green-sensing photodiode array 23 in a downward direction. A second HCCD shift register 27 area is formed to one side of storage area 24 and alternately receives the signal charges produced by the red-sensing and blue-sensing photodiode arrays 21 and 22. A transfer gate 25, provided in an isolation region of the green-sensing photodiode array 23 and the first HCCD shift register 26 area, transfers the signal charges produced by the green-sensing photodiode array 23 to the first HCCD shift register 26 area.

A plurality of poly gates 1 and 2, seen in FIGS. 2b and 2c, are formed between the red-sensing photodiode array 21 and the storage area 24 for transferring the signal charges in one direction based on a 3-phase clock signals generated by clock generator 300 or a 4-phase clock. Channel stop layers CST 33 (FIGS. 2b, 2c, and 3) are formed between isolation regions of photodiode arrays 21, 22 and 23 and include photodiode cells for isolating the signal charges. Preferably there are no channel stop regions between the blue and red photodiode arrays. As shown in FIG. 2b, a barrier layer is formed between the blue photodiode array and the red photodiode array when the clock signal $\phi R_1$ is applied to the poly gate 2 nearest the blue, otherwise the movement from blue to red shown in FIG. 4a as A4–A8 would not occur. An output gate 32 and an FD 30 are placed at one side of the first HCCD shift register 26, and an output gate 31 and an FD 29 are placed at one side of the second HCCD shift register 27. Sensing amplifiers 28a and 28b are connected to the FDs for sensing the signal charges. FIG. 2b shows metal light shielding layer 34 beside the green and red layers.

Figure 6:
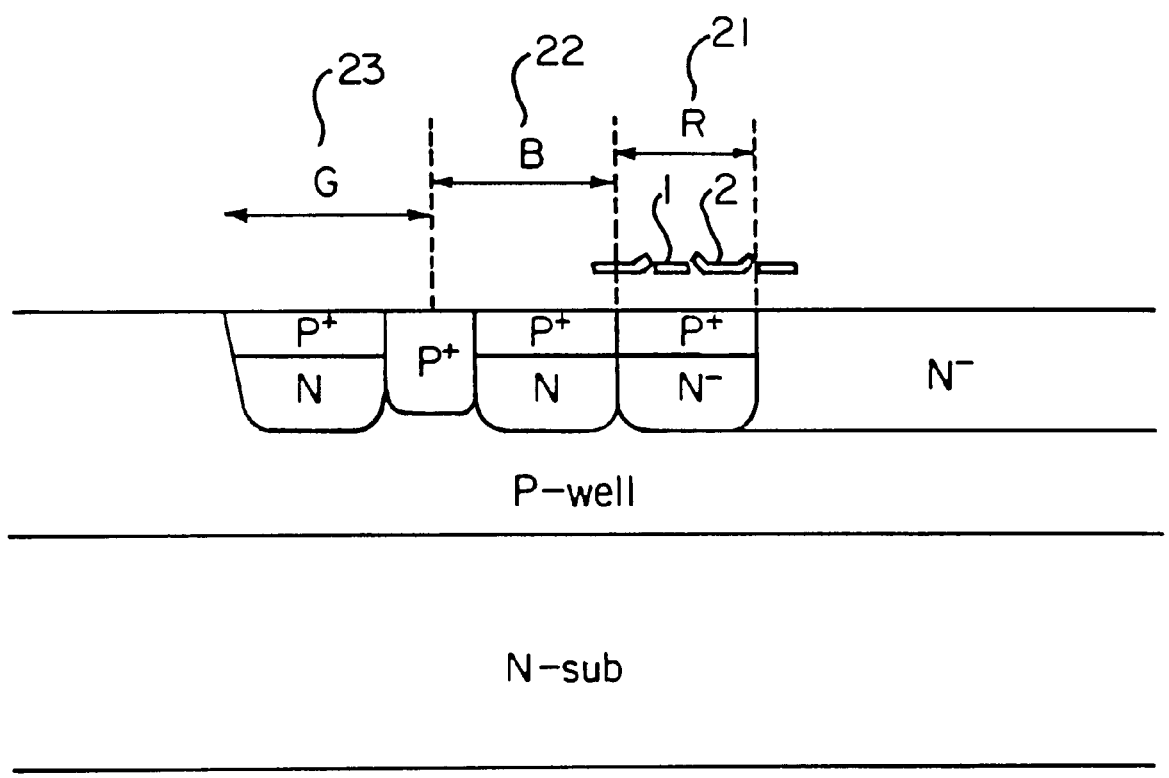

The potential of the blue-sensing photodiode array 22 area is set at a lower potential than that of the red-sensing photodiode array 21 area by adjusting the impurity density of implanted ions. FIG. 6 is a view of the potential wells associated with the respective colors. As shown, the potential well associated with the blue-sensing photodiode array is at a lower potential than the potential well associated with the red-sensing photodiode array.

The potential well of green-sensing photodiode array 23 area is set lower than that of the first HCCD shift register 26 area by adjusting the ion impurity density.

An image sensing operation of the color linear CCD image device will be described below.

Figure 4A:
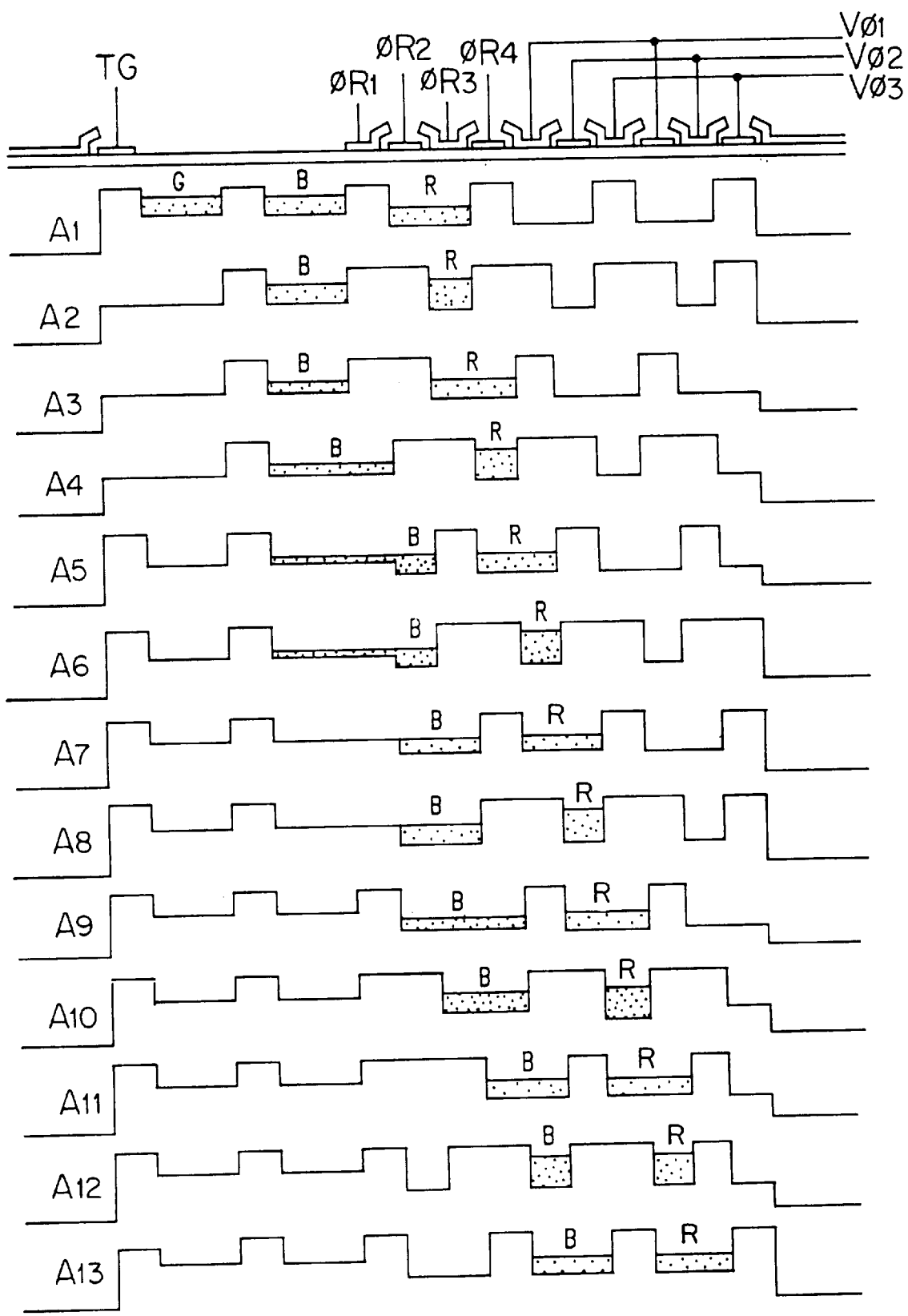
FIGS. 4(a) and 4(b) show a potential profile of the color linear CCD image device according to the present invention.
Figure 4B:
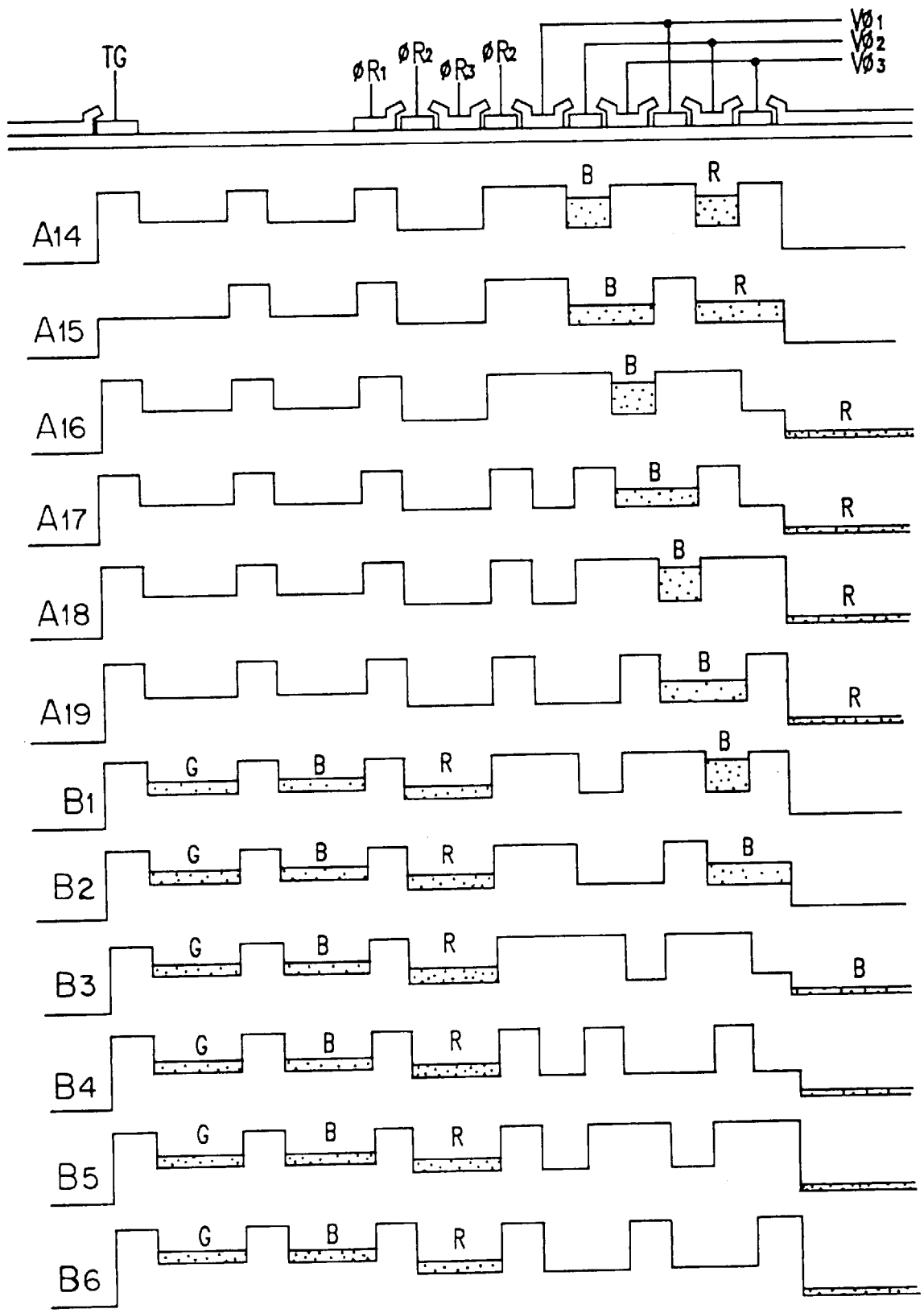
Figure 5:
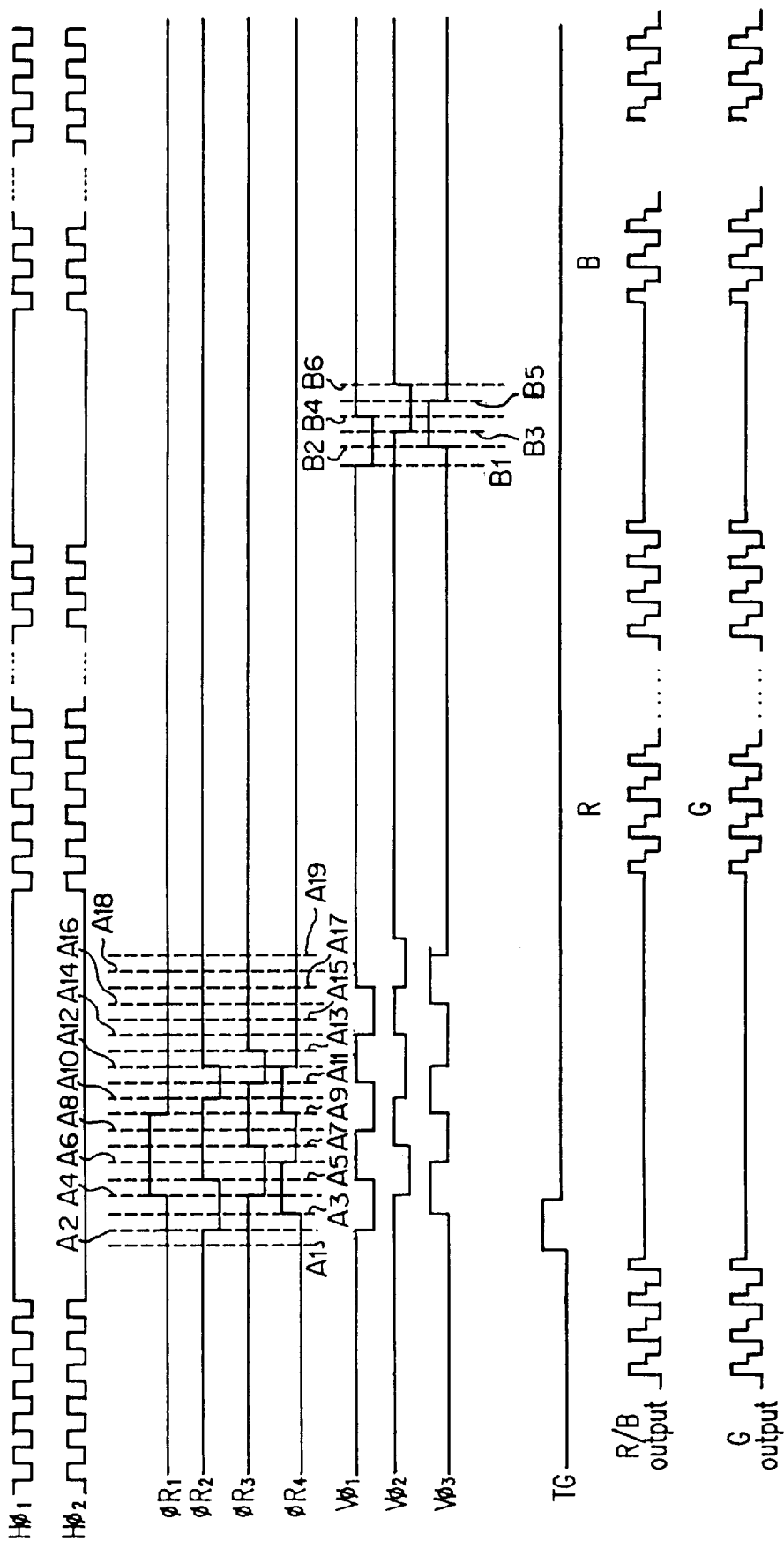
FIG. 5 shows the operational timing chart of the color linear CCD image device according to the present invention.

FIGS. 4(a) and 4(b) show a potential profile of the color linear CCD image device according to the present invention, and FIG. 5 shows the operational timing chart of the color linear CCD image device according to the present invention.

Signal charges produced by respective photodiode arrays 21, 22 and 23 by photoelectric conversion are extracted in the direction of the first and second HCCD shift registers 26 and 27. The red R and blue B signal charges are vertically moved by clock pulses $\phi R_1$, $\phi R_2$, $\phi R_3$, $\phi R_4$, $V\phi_1$, $V\phi_2$ and $V\phi_3$ applied to poly gates 1 and 2. Thus, the red and blue signal charges are respectively transferred to the second HCCD shift register 27 area, and the signal charges are read out by the FD 29 to sensing amplifier 28a.

Here, the signal charge transfer toward storage area 24 is performed such that a potential well region is varied to be moved between $A_1$–$A_{19}$ and $B_1$–$B_6$ by clock pulses $\phi R_1$, $\phi R_2$, $\phi R_3$, $\phi R_4$, $V\phi_1$, $V\phi_2$ and $V\phi_3$ during a blanking period of fixing the clock of the first and second HCCD shift registers 26 and 27. Clock pulses $\phi R_1$ and $V\phi_3$ are identical for the cases of $A_1$–$A_2$, $A_4$–$A_5$, $A_{12}$–$A_{14}$, $A_{18}$–$B_1$, and $B_5$–$B_6$. Clock pulses $\phi R_2$ and $V\phi_1$ are identical for the cases of $A_1$–$A_7$, $A_{10}$, $A_{12}$–$A_{13}$, $A_{17}$–$A_{19}$, and $B_4$–$B_6$. Clock pulses $\phi R_4$ and $V\phi_3$ are identical for cases $A_1$–$A_{14}$, $A_{18}$–$B_1$, and $B_5$–$B_6$. The clock pulses for the remaining cases are different.

The signal charges produced by the green-sensing photodiode array 23 are transferred to the first HCCD shift register 26 area by the clock pulse applied to transfer gate 25.

The reason for placing the blue-sensing photodiode array 22 in between the green and red-sensing photodiodes is described below.

Since the green signal charge output by the green-sensing photodiode array 23 corresponds to a lumina signal, it should be separately extracted. The luminance signal which represents the brightest signal is green. Therefore, it is provided at the lower end of the overall device region.

The wavelength of the blue light is short, and is absorbed by a polysilicon layer because of its property of absorbing light of a short wavelength, thereby lowering the sensitivity of the blue-sensing photodiode array 22.

Forming the blue-sensing photodiode array 22 as the center photodiode array is advantageous because the vertical movement of the signal charges from the blue-sensing photodiode array 22 to the second HCCD shift register 27 is carried out very rapidly, while the polysilicon layer inhibits the red signal component from mixing with the blue signal component, thus improving color separation.

Figure 7:
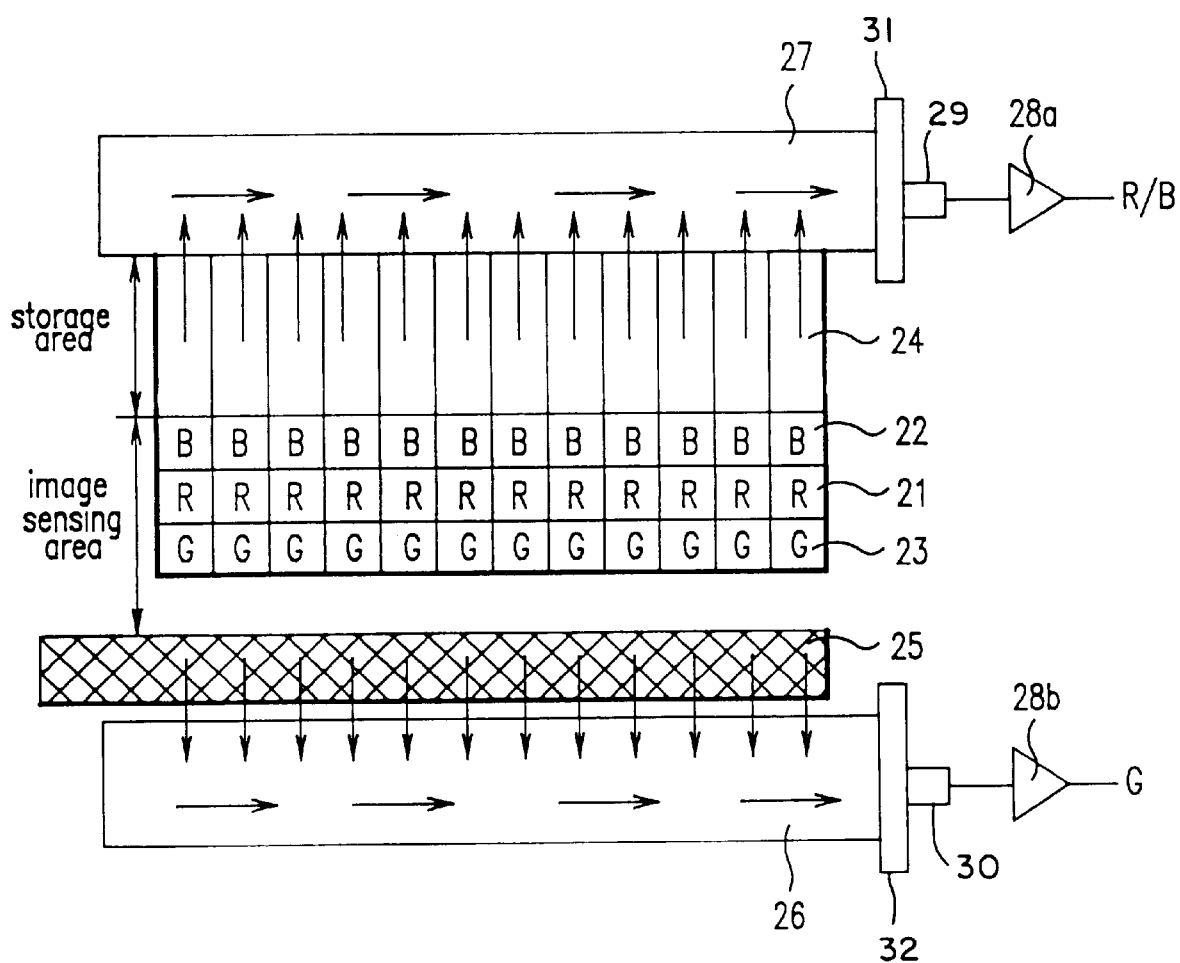
FIG. 7 is a view showing a construction of a color linear CCD image device according to a second embodiment of the present invention.

In another embodiment of the color linear CCD image device shown in FIG. 7, the red-sensing photodiode array 21 is placed at the center of the overall device region, flanked by the green-sensing photodiode array 23 on one side and the blue-sensing photodiode array 22 on the other side. The order in which the layers are formed is red, green and then blue. The other features of the color linear CCD image device of this embodiment is the same as discussed above with respect to the first embodiment.

A DC bias is applied to a polysilicon gate that is preferably formed above the area of the red-sensing photodiode array 21, so that the potential of the green-sensing photodiode array 23 area is lower than that of the red-sensing photodiode array 21 area, resulting in a potential step between the two arrays.

In the above described color linear CCD image device and driving method, the distance between respective photodiode arrays 21, 22 and 23 is reduced to enhance color resolution, and fewer transfer gates, FDs and sensing amplifiers are required to simplify the structure of the device.

Moreover, absorption characteristics of polysilicon degrades short wavelength light component and thus the polysilicon layer is preferably also not formed above the blue-sensing photodiode array.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A color linear charge coupled device (CCD) image device comprising:
   a photodiode array including a blue-sensing photo diode array formed between a red-sensing photodiode array and a green-sensing photodiode array, each of the photodiode arrays producing signal charges by photoelectric conversion;
   a storage area positioned on a side of said red-sensing photodiode array opposite said blue-sensing photodiode array for storing said signal charges produced by said red-sensing and blue-sensing photodiode arrays;
   a first horizontal charge coupled device (HCCD) shift register area positioned near a side of said green-sensing photodiode array opposite said blue-sensing photodiode array for accepting said signal charge produced by said green-sensing photodiode array; and
   a second HCCD shift register area formed beside said storage area for alternately accepting said signal charges produced by said red-sensing and blue-sensing photodiode arrays.

2. A color linear CCD image device as claimed in claim 1, further comprising a transfer gate, for transferring said signal charges produced by said green-sensing photodiode array to said first HCCD shift register area, provided in an isolation region of said green-sensing photodiode array and said first HCCD shift register.

3. A color linear CCD image device as claimed in claim 1, wherein a plurality of poly gates are alternately formed on said red-sensing photodiode array and said storage area.

4. A color linear CCD image device as claimed in claim 3, wherein said poly gates are driven by a 3-phase clock.

5. A color linear CCD image device as claimed in claim 3, wherein said poly gates are driven by a 4-phase clock.

6. A color linear CCD image device as claimed in claim 1, wherein each photodiode array includes a plurality of photodiode cells and a channel stop layer is formed between isolation regions of said photodiode cells of said photodiode arrays and between isolation regions of said blue-sensing photodiode array and said green-sensing photodiode array.

7. A color linear CCD image device as claimed in claim 1, wherein a potential of said blue-sensing photodiode array area is lower than a potential of said red-sensing photodiode array area.

8. A color linear CCD image device as claimed in claim 1, wherein a potential of said green-sensing photodiode array area is lower than a potential of said first HCCD shift register area.

9. A color linear CCD image device as claimed in claim 1, wherein said photodiode array is formed by sequentially placing said blue-sensing photodiode array at a center of the device, said green-sensing photodiode array to a first side of the blue-sensing photodiode array and said red-sensing photodiode array to a second side of the blue-sensing photodiode array.

10. A color linear CCD image device as claimed in claim 9, wherein said signal charges produced by said green-sensing photodiode array are transferred to said first HCCD shift register area by clock pulses applied to said transfer gate.

11. A color linear charge coupled device (CCD) image device comprising:
   a photodiode array including a red-sensing photo diode array formed between a blue-sensing photodiode array and a green-sensing photodiode array, each of the photodiode arrays producing signal charges by photoelectric conversion;
   a storage area positioned on a side of said blue-sensing photodiode array opposite said red-sensing photodiode array for storing said signal charges produced by said blue-sensing and red-sensing photodiode arrays;
   a first horizontal charge coupled device (HCCD) shift register area positioned near a side of said green-sensing photodiode array opposite said red-sensing photodiode array for accepting said signal charge produced by said green-sensing photodiode array; and
   a second HCCD shift register area formed beside said storage area for alternately accepting said signal charges produced by said red-sensing and blue-sensing photodiode arrays.

12. A color linear CCD image device as claimed in claim 11, further comprising a transfer gate, for transferring said signal charges produced by said green-sensing photodiode array to said first HCCD shift register area, provided in an isolation region of said green-sensing photodiode array and said first HCCD shift register.

13. A color linear CCD image device as claimed in claim 11, wherein each photodiode array includes a plurality of photodiode cells and a channel stop layer is formed between isolation regions of respective photodiode cells of said photodiode arrays and between isolation regions of said red-sensing photodiode array and said green-sensing photodiode array.

14. A color linear CCD image device as claimed in claim 11, wherein said photodiode array is formed by sequentially placing said red-sensing photodiode array at a center of the device, said green-sensing photodiode array to a first side of the red-sensing photodiode array and said blue-sensing photodiode array to a second side of the red-sensing photodiode array.

15. A color linear CCD image device as claimed in claim 11, further including a polysilicon gate formed over the red-sensing photodiode, wherein a DC bias is applied to the polysilicon gate to lower a potential of said green-sensing photodiode array relative to a potential of said red-sensing photodiode array.

16. In a driving method for driving a color linear charge coupled device (CCD) image device having red-sensing, blue-sensing, and green-sensing photodiode arrays for producing respective signal charges by photoelectric conversion, a storage area for storing said signal charges produced by the red-sensing and blue-sensing photodiode arrays, a second horizontal charge coupled device (HCCD) shift register for receiving said signal charges from said red-sensing and said blue-sensing photodiode arrays, a first HCCD shift register for receiving said signal charges produced by said green-sensing photodiode array, a plurality of poly gates formed to a first side of said red-sensing photodiode array and said storage area, and a transfer gate formed in an isolation region between said green-sensing photodiode array and said first HCCD shift register, said method for driving said color linear CCD image device comprising the steps of:
   sequentially transferring said signal charges produced by said red-sensing photodiode array and blue-sensing photodiode array toward said second HCCD shift register via said storage area by driving said poly gates;
   simultaneously driving said transfer gate to transfer said signal charges produced by said green-sensing photodiode array to said first HCCD shift register;

driving said first and second HCCD shift registers when said signal charges produced by said blue-sensing photodiode array are stored on any portion of said storage area and said signal charges produced by said red-sensing photodiode array are transferred to said second HCCD shift register to extract green and red signals; and moving said signal charges produced by said blue-sensing photodiode array to said second HCCD shift register when a clock signal is applied to said first and second shift registers.

17. A semiconductor device comprising:

a first plurality of light sensing elements sensing light of a first color and generating a first plurality of signal charges in response thereto;

a second plurality of light sensing elements disposed adjacent said first plurality of light sensing elements and sensing light of a second color and generating a second plurality of signal charges in response thereto;

a third plurality of light sensing elements disposed adjacent said second plurality of light sensing elements and sensing light of a third color and generating a third plurality of signal charges in response thereto;

a plurality of gates coupled to said first plurality of light sensing elements, said plurality of gates receiving said first and second pluralities of signal charges through said first plurality of light sensing elements and transferring said first and second plurality of signal charges to an output circuit; and a transfer gate coupled to said third plurality of light sensing elements, said transfer gate receiving said third plurality of signal charges, and transferring said plurality of third signal charges to said output circuit, wherein said output circuit includes
a first shift register coupled to said plurality of gates and receiving said first and second plurality of signal charges to output to a first output gate; and
a second shift register coupled to said transfer gate and receiving said third plurality of signal charges to output to a second output gate.

18. A semiconductor device in accordance with claim 17, wherein said light of said first color is red, said light of said second color is blue and said light of said third color is green.

19. A semiconductor device in accordance with claim 18, wherein said first and second registers are horizontal charge coupled devices (HCCDs).

20. A semiconductor device in accordance with claim 1, further comprising means for generating a plurality of timing signals supplied to said plurality of gates to sequentially transfer said first and second pluralities of signal charges to the output circuit in alternating succession.

21. A semiconductor device in accordance with claim 1, wherein said plurality of gates includes a plurality of polysilicon gates.

22. A semiconductor device comprising:

a substrate;

a first energy well region formed in said substrate;

a second energy well region formed in said substrate adjacent said first energy well region;

a third energy well region formed in said substrate, said third energy well region formed adjacent to said second energy well region opposite said first energy well region;

a first plurality of charge transfer gates provided on said substrate adjacent said second energy well region and overlying said first energy well region;

a charge transfer gate provided above and offset from said third energy well region; and a light shielding layer overlying said substrate and exposing said first, second and third energy well regions, wherein a first plurality of signal charges are generated in said first energy well region in response to exposure of said semiconductor device to light of a first color, a second plurality of signal charges are generated in said second energy well region in response to exposure of said semiconductor device to light of a second color, and a third plurality of signal charges are generated in said third energy well region in response to exposure of said semiconductor device to light of a third color, said first and second pluralities of signal charges being sequentially transferred beneath a surface of said substrate in a first direction by said first plurality of charge transfer gates, and said third plurality of signal charges are transferred in a second direction opposite said first direction by said second plurality of charge transfer gates.

23. A semiconductor device in accordance with claim 22, further comprising a channel stop layer provided in said substrate between said second and third energy well regions, and at least one of said plurality of first charge transfer gates overlies a portion of said substrate between said first and second energy well regions, such that when a voltage is supplied to said one of said plurality of first charge transfer gates, a potential barrier is created in said substrate between said first and second energy well regions.

24. A semiconductor device in accordance with claim 22, wherein a potential depth of said second energy well region is less than a potential depth of said first energy well region.

25. A semiconductor device in accordance with claim 22, further comprising a fourth energy well region receiving said third plurality of signal charges from said third potential well region, wherein a potential depth of said third energy well region is less than a potential depth of said fourth energy well region.

26. A charged coupled device (CCD) image sensor comprising:

a first photosensor array generating a first plurality of signal charges in response to exposure to light of a first color;

a second photosensor array disposed adjacent said first diode array and generating a second plurality of signal charges in response to exposure to light of a second color;

a third photosensor array generating a third plurality of signal charges in response to exposure to light of a third color, the second photosensor array is between the first and third photosensor arrays;

a plurality of first transfer gates extending over said first photosensor array;

a second transfer gate partially overlapping said third photosensor array; and a clock generator circuit supplying timing signals to said plurality of first transfer gates and said second transfer gate to transfer said first and second pluralities of signal charges in a first direction and to transfer said third plurality of signal charges in a second direction opposite to said first direction.

27. A CCD image sensor in accordance with claim 26, wherein said first and second pluralities of signal charges are transferred by said first plurality of transfer gates in alternating succession.

28. A CCD image sensor in accordance with claim 26, wherein said timing signals include four-phase timing signals.

29. A CCD image sensor in accordance with claim 26, wherein said timing signals include three-phase timing signals.

30. A charged coupled device (CCD) image sensor comprising:
   a substrate;
   a first linear array of photodiodes provided on said substrate for sensing red light and outputting first signal charges in response thereto;
   a second linear array of photodiodes provided on said substrate adjacent said first linear array of photodiodes for sensing blue light and outputting second signal charges in response thereto;
   a third linear array of photodiodes provided on said substrate for sensing green light and outputting third signal charges in response thereto, said second linear array of photodiodes adjacently disposed between said first and third linear arrays of photodiodes;
   a plurality of polysilicon gates provided on said substrate adjacent said first linear array of photodiode, said plurality of silicon gates receiving said first and second signal charges;
   a first CCD shift register coupled to said plurality of polysilicon gates, said plurality of polysilicon gates transferring said first and second signal charges to said first CCD shift register, and thereupon said first CCD shift register transferring said first and second signal charges sequentially to a first output node;
   a second CCD shift register; and
   a transfer gate provided adjacent to said third linear array of photodiodes for receiving said third signal charges and transmitting said third signal charges to said second CCD shift register, said second CCD shift register transferring said third signal charges sequentially to a second output node.

31. A method for operating an image sensor comprising the steps of:
   generating a first plurality of charges in response to light of a first color by a first light sensing element provided in a substrate;
   generating a second plurality of charges in response to light of a second color by a second light sensing element provided in the substrate;
   generating a third plurality of charges in response to light of a third color by a third light sensing element provided in the substrate;
   alternately supplying said first and second pluralities of charges to a first charge coupled device (CCD) shift register provided in the substrate to output to a first output gate; and
   supplying said third plurality of charges to a second CCD shift register provided in the substrate to output to a second output gate.

32. A method for operating an image sensor in accordance with claim 31, wherein said step of alternately supplying said first and second plurality of charges further includes the steps of:
   transferring said first plurality of signal charges to said first CCD shift register; and
   transferring said second plurality of signal charges to said first CCD shift register through said first light sensing element.

33. A method in accordance with claim 31, wherein said alternately supplying step includes supplying timing signals to a plurality of polysilicon gates provided on substrate between said second light sensing element and said first CCD shift register.

34. A method for operating an image sensor in accordance with claim 31, wherein said alternately supplying step includes the step of transferring said first and second pluralities of signal charges through said first light sensing element in a first direction; and
   said supplying step includes the step of transferring said third signal charges in a second direction opposite to said first direction.

35. An image sensor comprising:
   first light detecting means for generating first signal charges in response to a first color of light;
   second light detecting means for generating second signal charges in response to a second color of light;
   third light detecting means for generating third signal charges in response to a third color of light;
   first charge transferring means coupled to said first light detecting means for transferring said first and second signal charges to a first output gate, said second signal charges being transferred through said first light detecting means; and
   second charge transferring means coupled to said third light detecting means for transferring said third signal charges to a second output gate.

* * * * *

UNITED STATES PATENT AND TRADEMARK OFFICE
CERTIFICATE OF CORRECTION

PATENT NO.: 6,034,366
DATED: March 7, 2000
INVENTOR: Young-June YU

It is certified that an error appears in the above-identified patent and that said Letters Patent is hereby corrected as shown below:

Claim 1, Column 5, line 9, "photo diode" should read --photodiode--.

\* Claim 20, Column 7, line 47, "claim 1" should read --claim 17--.

\* Claim 21, Column 7, line 52, "claim 1" should read --claim 17--.

Claim 30, Column 9, line 21, photodiode" should read --photodiodes--.

Signed and Sealed this

Twenty-seventh Day of March, 2001

Attest:

NICHOLAS P. GODICI

Attesting Officer

*Acting Director of the United States Patent and Trademark Office*